(12) United States Patent
Martinson et al.

(10) Patent No.: US 7,427,210 B2
(45) Date of Patent: Sep. 23, 2008

(54) SINGLE LOADING MECHANISM TO APPLY FORCE TO BOTH COOLING APPARATUS AND INTEGRATED CIRCUIT PACKAGE

(75) Inventors: Robert R. Martinson, Hillsboro, OR (US); Alin Ila, Phoenix, AZ (US); Mandy Mistkawi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 7 days.

(21) Appl. No.: 11/426,929

(22) Filed: Jun. 27, 2006

(65) Prior Publication Data

US 2007/0297143 A1 Dec. 27, 2007

(51) Int. Cl.
*H01R 13/00* (2006.01)
(52) U.S. Cl. ...................................... 439/487
(58) Field of Classification Search ............... 439/487, 439/489, 66–67, 330–331, 259, 327–328; 361/704
See application file for complete search history.

(56) References Cited

U.S. PATENT DOCUMENTS

| | | | |
|---|---|---|---|
| 6,672,892 B2 * | 1/2004 | Chandran et al. | 439/330 |
| 6,731,506 B1 * | 5/2004 | Dong et al. | 361/719 |
| 7,195,507 B2 * | 3/2007 | Watanabe | 439/331 |
| 7,230,830 B2 * | 6/2007 | Ujike et al. | 361/704 |
| 2005/0111188 A1 * | 5/2005 | Bhattacharya et al. | 361/699 |
| 2005/0218035 A1 | 10/2005 | Pearson et al. | |
| 2006/0046527 A1 | 3/2006 | Stone et al. | |
| 2006/0091538 A1 | 5/2006 | Kabadi | |
| 2006/0094265 A1 | 5/2006 | Zheng | |

OTHER PUBLICATIONS

LGA775 Socket Mechanical Design Guide, Feb. 2006, Intel Corporation, Document No. 302666-003, 25 pages.

* cited by examiner

*Primary Examiner*—J. F. Duverne
(74) *Attorney, Agent, or Firm*—Blakely, Sokoloff, Taylor & Zafman LLP

(57) ABSTRACT

Embodiments of the invention provide single loading mechanism that both pushes a semiconductor package against a socket and pushes a cooling solution against the semiconductor package. This loading mechanism may take up less motherboard real estate than if two different attachment and loading mechanisms were used.

14 Claims, 5 Drawing Sheets

SINGLE LOADING MECHANISM TO APPLY FORCE TO BOTH COOLING APPARATUS AND INTEGRATED CIRCUIT PACKAGE

BACKGROUND

Background of the Invention

Semiconductor devices, such as microprocessor dies, are typically mounted in a package and attached to a printed circuit board (PCB), such as a motherboard, through a socket. The socket interfaces with connections on the package to distribute power to and signals from the package (and the semiconductor device) to other devices. Several technologies exist for making connections between the socket and the package, including pin grid array (PGA), ball grid array (BGA), and land grid array (LGA).

LGA sockets include spring-loaded contacts to interface with conductive pads on a packaged semiconductor device. The socket may be soldered onto a motherboard with BGA contacts (e.g., solder balls) under the socket. The spring-loaded contacts are pushed against the pads of the package when the package is inserted into the socket and a force applied to the package. This pressure assures reliable electric connection between the motherboard and the package.

Available area on a motherboard, particularly in small form-factor devices such as laptop computers and the like, is limited. Some of this area is used to connect a loading apparatus that pushes the contacts of the package against the socket. More of this area is used to connect cooling solution that keeps the semiconductor device from overheating. This cooling solution may also have a second loading apparatus that pushes the cooling solution against the semiconductor device.

BRIEF DESCRIPTION OF THE DRAWINGS

FIG. 1b is a top view that further illustrates an embodiment of the device described with respect to FIG. 1a.

DETAILED DESCRIPTION

In various embodiments, an apparatus that uses a single loading mechanism to apply a force to both a semiconductor device and a cooling apparatus is described. In the following description, various embodiments will be described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Figure 1A:
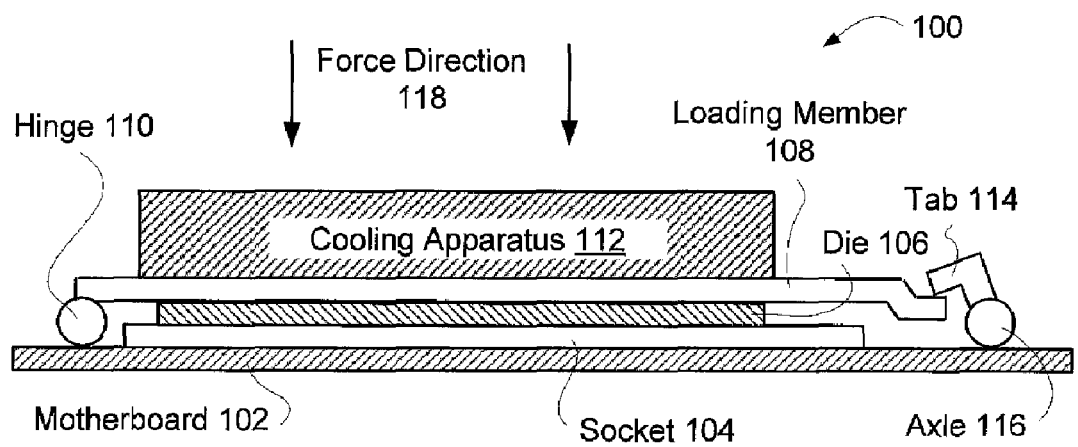
FIG. 1a is a cross sectional side view that illustrates one embodiment of a device with one loading mechanism that applies a force to couple an integrated circuit package to a socket and also to push a cooling apparatus against the integrated circuit package.

FIG. 1a is a cross sectional side view that illustrates one embodiment of a device 100 with one loading mechanism that applies a force to couple an integrated circuit package to a socket and also to push a cooling apparatus against the integrated circuit package. In the illustrated embodiment, the socket 104 is coupled to a motherboard 102, which may be, for example, within a personal computer such as a laptop or desktop computer. While the socket 104 is described as being coupled to a "motherboard" 102, in other embodiments, the socket 104 may be coupled to any type of printed circuit board 102 or another suitable support structure.

In an embodiment, the socket 104 is a land grid array (LGA) socket with spring-loaded contacts to interface with conductive pads on an integrated circuit package 106. In other embodiments, the socket 104 may be a different type of socket for which a force pushing the integrated circuit package 106 against the socket 104 may be of benefit. The socket 106 is the structure by which the integrated circuit package 106 is electrically or otherwise communicably connected to other components of a device 100.

The integrated circuit package 106 may be any type of integrated circuit. In an embodiment, the integrated circuit package 106 may be a microprocessor die. In other embodiments, other types of integrated circuit packages 106 may be used. There may be a force acting in a direction 118 suitable to push the integrated circuit package 106 against the socket 104, to help provide a good contact between the integrated circuit package 106 and the socket 104.

A cooling apparatus 112 may be included in the device 100 to remove heat from the integrated circuit package 106 during operation. Any suitable cooling apparatus 112 may be used, such as a heat pipe, a heat sink, or another type of cooling apparatus 112. There may be a force acting in a direction 118 suitable to push the cooling apparatus 112 against the integrated circuit package 106 to help the cooling apparatus 112 make good contact with the integrated circuit package 106 for heat conduction between the two.

In an embodiment, there is a single loading mechanism that provides force 118 to both press the integrated circuit package 106 against the socket 104 and press the cooling apparatus 112 against the integrated circuit package 106. In the embodiment illustrated in FIG. 1a, this single loading mechanism may be considered to be or include a loading member 108 that is hingedly-connected to the motherboard 102 by hinge 110. When in a closed position, the loading member 108 pushes down on the integrated circuit package 106 to press the integrated circuit package 106 against the socket 104. The cooling apparatus 112 is attached to the loading member 108 in the illustrated embodiment, so that when the loading member 108 is in a closed position the cooling apparatus 112 is pushed against the integrated circuit package 106. In some embodiments, the cooling apparatus 112 is connected to the loading member 108, and not independently connected to the motherboard 102.

In an embodiment, the cooling apparatus 112 may be pushed against the integrated circuit package 106 when the loading member 108 is in a closed position, and the cooling apparatus 112 may transfer force from the loading member 108 to the integrated circuit package 106 to push the integrated circuit package 106 against the socket 104. Such embodiments may lack direct contact between the loading member 108 and the integrated circuit package 106. Other types of loading mechanisms besides the loading member 108 illustrated may be used to apply such a force to the cooling apparatus 112 in such embodiments.

In the illustrated embodiment, there is a tab 114 connected to an axle 116. The tab 114 rotates about the axle 114 to force the loading member 108 down and cause the force 118 on the cooling apparatus 112 and integrated circuit package 106. The tab 114 also keeps the loading member 108 in place. In other embodiments, other structures may be used to cause the force 118 on the cooling apparatus 112 and integrated circuit package 106.

Figure 1B:
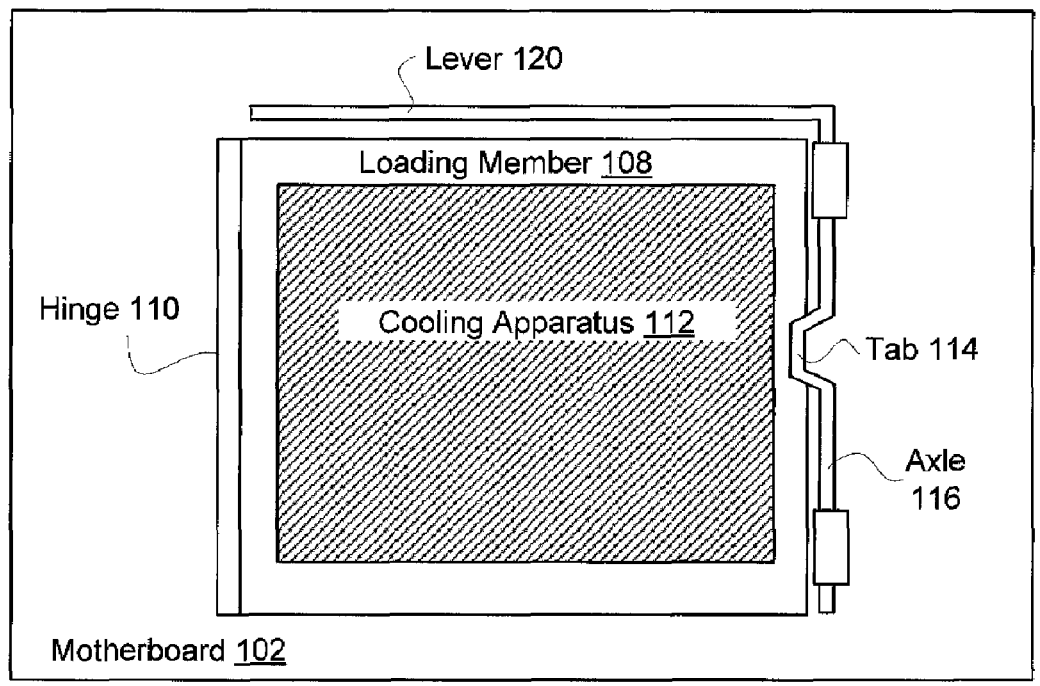

FIG. 1b is a top view that further illustrates an embodiment of the device 100 described above with respect to FIG. 1a. In the embodiment shown in FIG. 1b, the loading member 108 is a piece of metal or other stiff material suitable to apply an appropriate force. The loading member 108 includes an outer frame and a central opening (obscured in FIG. 1b by the cooling apparatus 112) through which the cooling apparatus 112 may contact the integrated circuit package 106 so that heat may be conducted away from the integrated circuit package 106. In other embodiments, the loading member 108 may have other shapes.

In the illustrated embodiment, the loading member 108 is attached at one side to hinge 110. At the other side, a tab 114 presses down on the loading member 108, causing the loading member 108 to apply a force to the integrated circuit package 106 and cooling apparatus 112. The tab 114 is connected to an axle 116, which is connected to a lever 120. The lever 120 is used to rotate the tab 114 into a closed position to press down on the loading member 108 from an open position. The lever 120 may also be locked into the closed position, so that the force 118 is continually applied after the tab 114 is moved to the closed position.

As the tab 114 in the closed position pressed down on the loading member 108 and the integrated circuit package 106 is between the loading member 108 and the socket 104, the loading member 108 presses the integrated circuit package 106 against the socket 104. As the cooling apparatus 112 is connected to the loading member 108, the cooling apparatus 112 is pressed against the integrated circuit package 106 by the loading member 108. Thus, a single mechanism (the loading member 108) simultaneously applies a force 118 to both the integrated circuit package 106 and the cooling apparatus. In various other embodiments, a loading mechanism may press the cooling apparatus 112 against the integrated circuit package 106 and thereby press the integrated circuit package 106 to the socket 104. In such embodiments that lack direct contact between a loading member 108, a single mechanism still may simultaneously apply a force 118 to both the integrated circuit package 106 and the cooling apparatus.

Figure 1C:
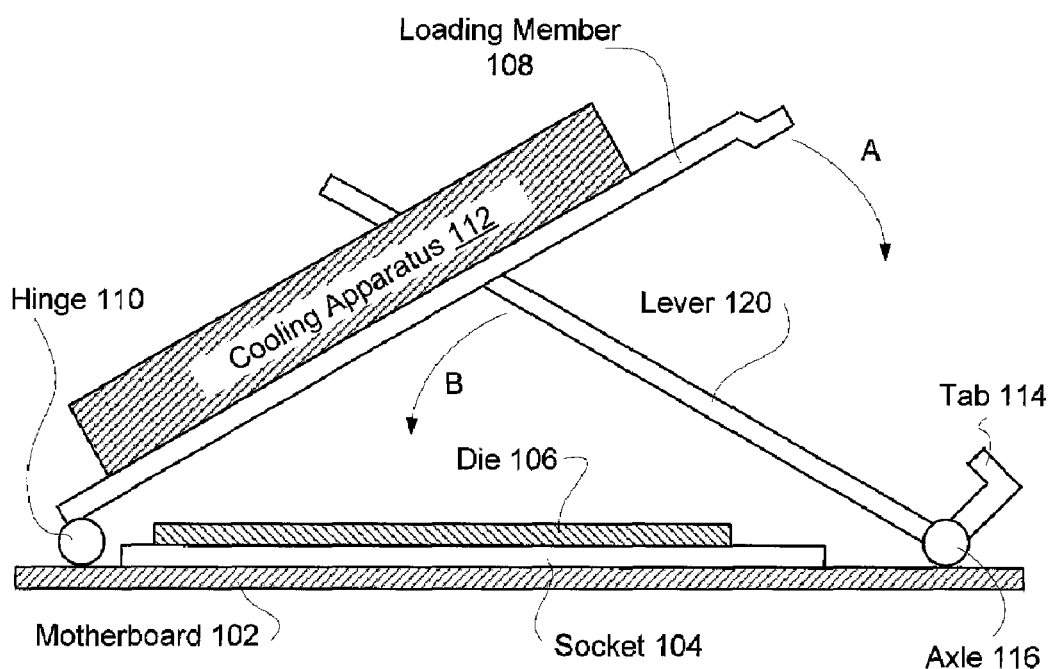
FIG. 1c is a cross sectional side view that illustrates the embodiment of a device described with respect to FIG. 1a when the loading member is in an open position.

FIG. 1c is a cross sectional side view that illustrates the embodiment of a device 100 described above with respect to FIG. 1a when the loading member 108 is in an open position. As can be seen in the embodiment illustrated in FIG. 1c, the cooling apparatus 112 is connected to the loading member 108. Any suitable method may be used to connect the cooling apparatus 112 to the loading member 108.

Both the loading member 108 and the lever 120 may be capable of moving in an arc. As seen in FIG. 1c, the loading member 108 has an arc A of movement through which it can travel between an open position (such as that seen in FIG. 1c) and a closed position (such as that seen in FIGS. 1a and 1b). Similarly, the lever 120 has an arc B of movement through which it can travel between an open position (such as that seen in FIG. 1c) and a closed position (such as that seen in FIGS. 1a and 1b). When the loading member 108 is close to the closed position, the lever 120 may engage the loading member 108 as the lever 120 is moved to its closed position. As the lever 120 is completely moved to its closed position, it may cause the tab 114 to apply a force to the loading member 108 to move the loading member 108 to its closed position where it applies a force to the integrated circuit package 106 and cooling apparatus 112.

Figure 2:
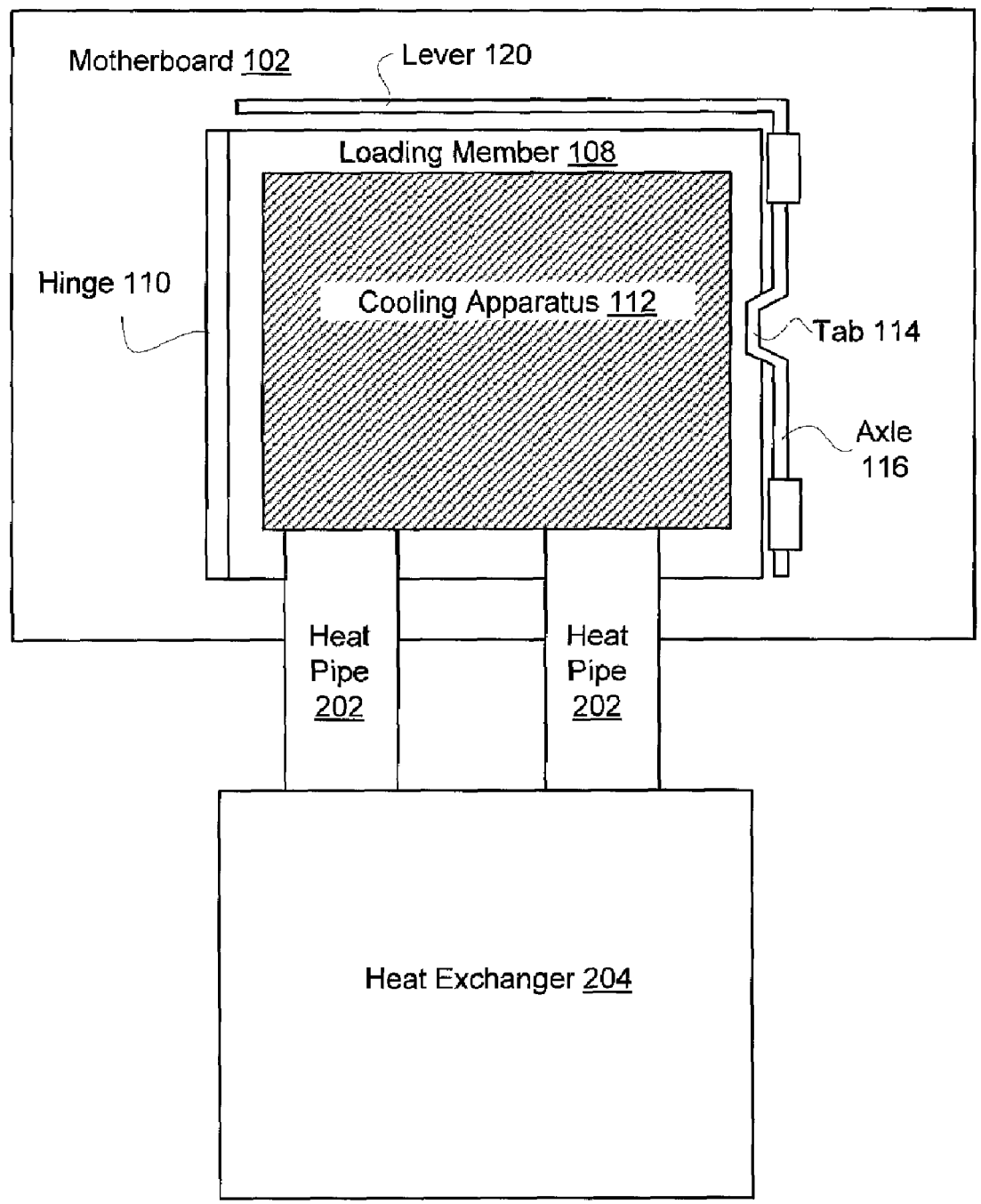
FIG. 2 is a top view that illustrates an embodiment where the cooling apparatus is connected to additional cooling components.

FIG. 2 is a top view that illustrates an embodiment where the cooling apparatus 112 is connected to additional cooling components. For example, the cooling apparatus 112 may comprise one or more heat pipes 202 that transfer the heat from the integrated circuit package 106 to a heat exchanger 204, such as a heat sink, which helps transfer the heat from the integrated circuit package 106 to the surrounding environment. In an embodiment where the loading member 108 is hingedly-attached to the motherboard 102, one or more of the additional cooling components may move at the same time the cooling apparatus 112 and loading member 108 move. In other embodiments, there may be a flexible connection between the cooling apparatus and other cooling components, or the cooling apparatus 112 may be unconnected to the additional cooling components until the loading member 108 is in a closed position. In other embodiments, other arrangements may exist. The additional cooling components may be positioned at any suitable location.

Figure 3:
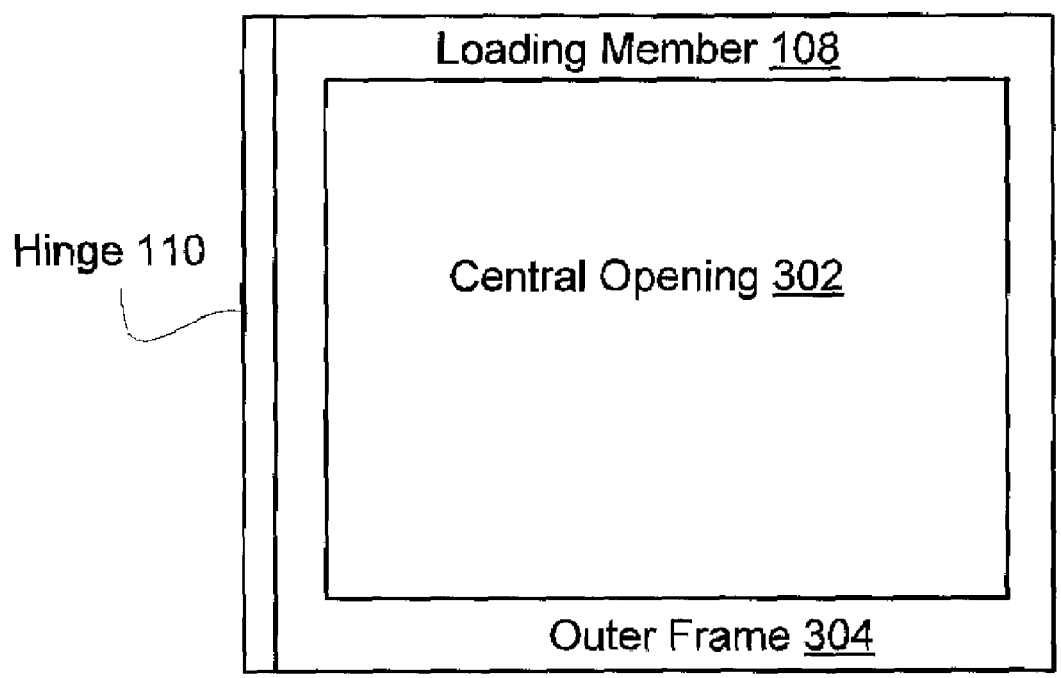
FIG. 3 is a top view that illustrates an embodiment of the loading member.

FIG. 3 is a top view that illustrates an embodiment of the loading member 108. In this embodiment, the loading member 108 has an outer frame 304, with a central opening 302 through which the cooling apparatus 112 may contact the integrated circuit package 106. While the loading member 108 is so illustrated, it may take other forms in other embodiments. For example, the loading member 108 may lack a continuous frame all around its perimeter.

Figure 4:
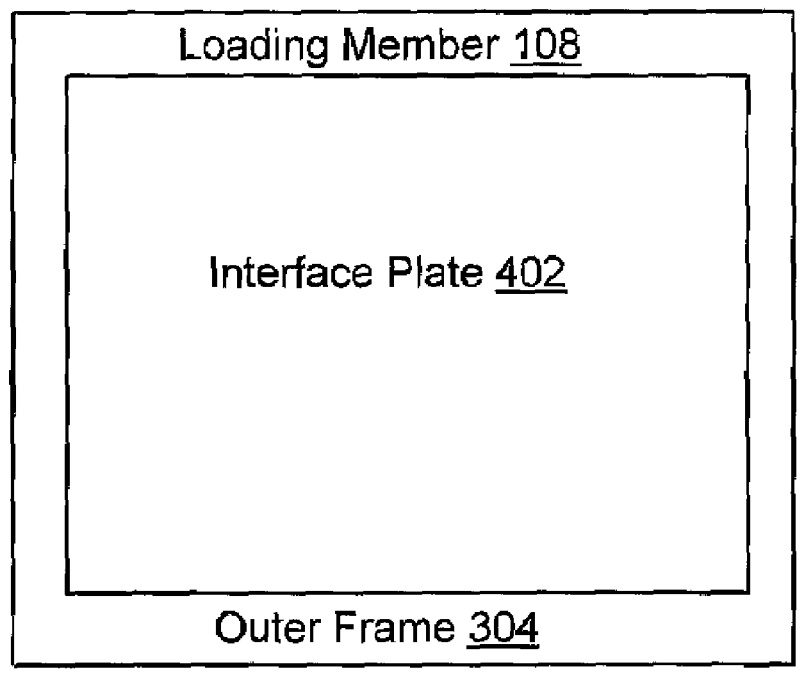
FIG. 4 is a top view that illustrates another embodiment of the loading member.

FIG. 4 is a top view that illustrates another embodiment of the loading member 108. In this embodiment, the loading member 108 includes an interface plate 402. In the closed position, the interface plate 402 may be in contact with or close proximity to (such as separated by a thin layer of thermal interface material) the integrated circuit package 106 to effectively transfer the heat from the integrated circuit package 106 to the cooling apparatus 112.

The loading member 108 may be a portion of the cooling apparatus 112, rather than a separate component, in some embodiments. Thus, the interface plate 402 may be a portion of the cooling apparatus 112 that transfers heat from the integrated circuit package 106 to the cooling apparatus 112, and the outer frame 304 a different portion of the cooling apparatus 112. Either one or both of the outer frame 304 and interface plate 402 may apply a force to the integrated circuit package 106.

Figure 5:
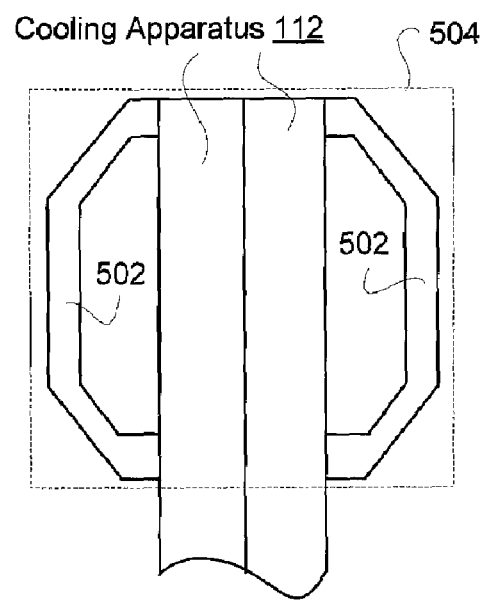
FIG. 5 is a top view that illustrates an embodiment where there is no separate cooling apparatus and loading member, but rather the cooling apparatus acts to apply a force to the integrated circuit package.

FIG. 5 is a top view that illustrates an embodiment where there is no separate cooling apparatus 112 and loading member 108, but rather the cooling apparatus 112 acts to apply a force 118 to the integrated circuit package 106. In such an embodiment, the cooling apparatus 112 may include stiffening features 502 that may not be present in a similar cooling apparatus 112 that does not also act to apply a force to the integrated circuit package 106. In the embodiment shown in FIG. 5, the cooling apparatus 112 includes heat pipes 202. A loading mechanism (not shown) applies a force to the heat pipes 202, which in turn apply a force to the integrated circuit package 106 beneath (an outline of the position 504 of the integrated circuit package 106 is illustrated).

The cooling apparatus 112 includes stiffening features 502 that allow the cooling apparatus 112 to apply force to all appropriate areas of the integrated circuit package 106. As shown, the stiffening features 502 are at the perimeter. In other embodiments, stiffening features may be present at other locations in place of, or in addition to perimeter stiffening features 502. For example, stiffening features 502 may be present at locations where force is applied to the cooling apparatus 112 to allow the cooling apparatus 112 to distribute a relatively even force to the integrated circuit package 106, rather than bending and applying a significantly uneven force to the integrated circuit package 106.

Figure 6:
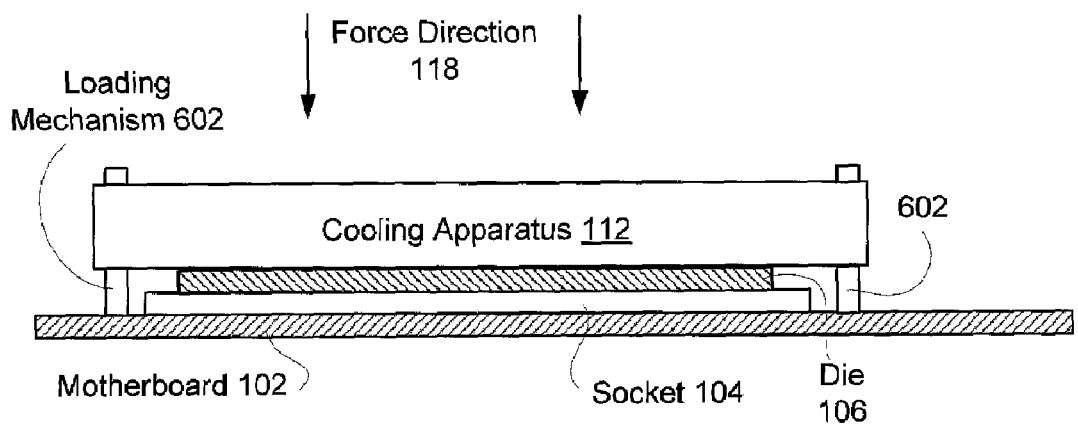
FIG. 6 is a cross sectional side view that illustrates another embodiment where there is not both a cooling apparatus and a discrete loading member.

FIG. 6 is a cross sectional side view that illustrates another embodiment where there is not both a cooling apparatus 112 and a frame-type loading member 108 as illustrated in FIGS. 1a-1c. Rather, the cooling apparatus 112 is a loading member and a loading mechanism 602 applies a force to the cooling apparatus 112, and thereby to the integrated circuit package 106 via the cooling apparatus 112. For example, the cooling apparatus 112 may be a heat sink with a fan, and the loading mechanism 602 may be one or more screws that connect the cooling apparatus 112 to the motherboard 102. When tightened, the screws 602 may press the cooling apparatus 112 down causing a force 118 to push the cooling apparatus 112 against the integrated circuit package 106 and the integrated circuit package 106 against the socket 104. While screws 602 are mentioned as the loading mechanism, any other suitable type of loading mechanism may be used, such as a spring-loaded clip or other mechanism. A screw 602 or other loading mechanism 602 may also be considered a "loading member" 108, as it may apply a force to both the cooling apparatus 112 and integrated circuit package 106.

As seen in FIG. 6, some embodiments may lack separate devices that connect the cooling apparatus 112 and the loading member 108 to the motherboard 102. Rather, a single device or set of devices (the loading mechanism 602) connects and loads both the cooling apparatus 112 and the loading member 108 (which in the embodiment of FIG. 6 are the same thing). Such an arrangement saves space on the motherboard 102 versus devices 100 in which separate connections are used—one connection for the cooling apparatus 112 and another connection for a loading member 108 that solely loads the integrated circuit package 106 against the socket 104.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A device, comprising:
　a socket;
　a loading mechanism including a loading member frame, the loading member frame having a hinge hingedly connecting the loading member frame to the socket;
　a cooling apparatus connected to the loading member frame;
　wherein the loading member frame is movable through an arc of movement between a first open position and a second closed position, wherein the loading member frame is configured such that, in the second closed position thereof, it extends substantially parallel to the socket, and is adapted to simultaneously:
　　apply a direct force to an integrated circuit package disposed between the loading member frame and the socket to press the integrated circuit package against the socket; and
　　apply a direct force to the cooling apparatus to press the cooling apparatus against the integrated circuit package.

2. The device of claim 1, wherein the loading mechanism further includes a lever having an arm, an engagement tab connected to the arm, and a hinge hingedly connecting the lever to the socket, the lever being movable through an arc of movement between a first open position and a second closed position, wherein the lever is configured such that, in the second closed position thereof, a movement of the arm about the hinge causes the engagement tab to engage and apply a force to the loading member frame when the loading member frame is in its second closed position, the loading member thereby applying a force to the integrated circuit package and to the cooling apparatus.

3. The device of claim 2, wherein the loading member frame comprises an outer frame, the cooling apparatus being in a central area of the outer frame.

4. The device of claim 1, wherein the cooling apparatus is fixedly-attached to the loading member frame.

5. The device of claim 4, wherein cooling apparatus comprises a heat pipe.

6. A device, comprising:
　a printed circuit board;
　a socket on the printed circuit board;
　an integrated circuit connected to the socket;

a loading mechanism including a loading member frame, the loading member having a hinge hingedly connecting the loading member frame to one of the socket and the printed circuit board;

a cooling apparatus connected to the loading member frame;

wherein the loading member frame is movable through an arc of movement between a first open position and a second closed position, wherein the loading member frame is configured such that, in the second closed position thereof, it extends substantially parallel to the socket, and is adapted to simultaneously:

apply a direct force to an integrated circuit package disposed between the loading member frame and the socket to press the integrated circuit package against the socket; and apply a direct force to the cooling apparatus to press the cooling apparatus against the integrated circuit package.

7. The device of claim 6, wherein the cooling apparatus comprises a heat-conducting material to conduct heat from the integrated circuit and a heat dispersion portion connected to the heat-conducting material to disperse heat received from the integrated circuit to the surrounding environment.

8. The device of claim 7, wherein the cooling apparatus includes a heat pipe to transfer heat from the integrated circuit.

9. The device of claim 6, wherein the integrated circuit is a microprocessor.

10. The device of claim 6 wherein cooling apparatus is connected to the loading member frame and is not independently connected to the printed circuit board.

11. The device of claim 6, wherein the cooling apparatus comprises a heat pipe.

12. The device of claim 6, wherein the cooling apparatus comprises a heat sink.

13. The device of claim 6, wherein the loading mechanism comprises a lever having an arm, an engagement tab connected to the arm, and a hinge hingedly connecting the lever to one of the socket and the printed circuit board, the lever being movable through an arc of movement between a first open position and a second closed position, wherein the lever is configured such that, in the second closed position thereof, a movement of the arm about the hinge causes the engagement tab to engage and apply a force to the loading member frame when the loading member is in its second closed position, the loading member frame thereby applying a force to the integrated circuit package and to the cooling apparatus.

14. The device of claim 6, wherein the loading mechanism comprises a screw.

* * * * *